(12) United States Patent
Sutardja et al.

(10) Patent No.: US 9,275,731 B1
(45) Date of Patent: Mar. 1, 2016

(54) SYSTEMS AND METHODS FOR INCREASING THE READ SENSITIVITY OF A RESISTIVE RANDOM ACCESS MEMORY (RRAM)

(71) Applicant: Marvell International Ltd., Hamilton (BM)

(72) Inventors: Pantas Sutardja, Los Gatos, CA (US); Albert Wu, Palo Alto, CA (US); Runzi Chang, San Jose, CA (US); Winston Lee, Palo Alto, CA (US); Peter Lee, Pleasanton, CA (US)

(73) Assignee: Marvell International Ltd., Hamilton (BM)

( * ) Notice: Subject to any disclaimer, the term of this patent is extended or adjusted under 35 U.S.C. 154(b) by 65 days.

(21) Appl. No.: 14/044,281

(22) Filed: Oct. 2, 2013

Related U.S. Application Data

(60) Provisional application No. 61/710,309, filed on Oct. 5, 2012.

(51) Int. Cl.
*G11C 11/00* (2006.01)
*G11C 13/00* (2006.01)
*G06F 13/00* (2006.01)

(52) U.S. Cl.
CPC ............ *G11C 13/0069* (2013.01); *G06F 13/00* (2013.01); *G11C 13/004* (2013.01); *G11C 13/0009* (2013.01); *G11C 2213/79* (2013.01)

(58) Field of Classification Search
CPC ............ G11C 13/004; G11C 13/0007; G11C 13/0009
USPC .......................................................... 365/148
See application file for complete search history.

(56) References Cited

U.S. PATENT DOCUMENTS

| | | | |
|---|---|---|---|
| 6,856,536 B2 * | 2/2005 | Rinerson et al. | 365/148 |
| 7,006,371 B2 * | 2/2006 | Matsuoka | 365/148 |
| 7,242,606 B2 * | 7/2007 | Hachino et al. | 365/148 |
| 7,471,543 B2 * | 12/2008 | Nakashima et al. | 365/148 |
| 7,760,539 B2 * | 7/2010 | Katoh | 365/148 |
| 7,835,171 B2 * | 11/2010 | Ono et al. | 365/148 |
| 8,228,715 B2 * | 7/2012 | Andre et al. | 365/158 |
| 2008/0025070 A1 * | 1/2008 | Horii et al. | 365/148 |
| 2010/0135066 A1 * | 6/2010 | Jung et al. | 365/158 |
| 2011/0228587 A1 * | 9/2011 | Ito | 365/148 |
| 2013/0235649 A1 * | 9/2013 | Lindstadt et al. | 365/148 |
| 2013/0242640 A1 * | 9/2013 | Haukness et al. | 365/148 |
| 2014/0115296 A1 * | 4/2014 | Diep et al. | 711/206 |
| 2014/0169062 A1 * | 6/2014 | Lee et al. | 365/148 |

* cited by examiner

*Primary Examiner* — Son Mai

(57) ABSTRACT

A resistive random access memory system includes a plurality of bitlines, a plurality of wordlines, and an array of resistive random access memory cells. Each of the resistive random access memory cells in the array includes a transistor and a resistive random access memory element connected in a common gate configuration.

21 Claims, 4 Drawing Sheets

SYSTEMS AND METHODS FOR INCREASING THE READ SENSITIVITY OF A RESISTIVE RANDOM ACCESS MEMORY (RRAM)

CROSS-REFERENCE TO RELATED APPLICATIONS

This application claims the benefit of U.S. Provisional Application No. 61/710,309, filed on Oct. 5, 2012. The entire disclosure of the application referenced above is incorporated herein by reference.

FIELD

The present disclosure relates to resistive random access memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A resistive random access memory (RRAM) array includes RRAM cells arranged at intersections of word lines and bitlines. A RRAM cell includes an insulating material (e.g., a dielectric) as a resistive element. The resistance of the insulating material increases when current is passed through the insulating material in one direction and decreases when current is passed through the insulating material in an opposite direction. Accordingly, the RRAM cell can be programmed to a high resistance state by passing current through the RRAM cell in one direction and a low resistance state by passing current through the RRAM cell in an opposite direction. The high resistance state can be used to denote logic high (binary 1), and the low resistance state can be used to denote logic low (binary 0), or vice versa. Once written, read operation can be performed using either direction of current flow.

FIG. 1 shows an example of a memory 100 including a plurality of RRAM memory cells 102-1, 102-2, ... and 102-R (collectively RRAM memory cells 102), where R is an integer greater than one. The RRAM memory cells 102 in FIG. 1 are located along a bitline. Each of the RRAM memory cells 102-1, 102-2, ... and 102-R includes a transistor $T_1, T_2, \ldots T_R$ and an RRAM element represented by resistors $R_{RRAM\_1}, R_{RRAM\_2}, \ldots,$ and $R_{RRAM\_R}$, respectively.

One end of the RRAM elements $R_{RRAM\_1}, R_{RRAM\_2}, \ldots,$ and $R_{RRAM\_R}$ is connected to first terminals of the transistors $T_1, T_2, \ldots T_R$. Another end of the RRAM elements $R_{RRAM\_1}, R_{RRAM\_2}, \ldots,$ and $R_{RRAM\_R}$ is connected to a first bitline terminal BLP. Second terminals of the transistors $T_1, T_2, \ldots T_R$ are connected to a second bitline terminal BLN, which may be a ground reference. Gates of the transistors $T_1, T_2, \ldots T_R$ are connected to wordlines $WL_1, WL_2, \ldots, WL_R$, respectively.

As can be appreciated, the memory 100 may include additional columns and rows of RRAM memory cells 102. Additional bitline terminals BLP and BLN may be connected to the other columns of RRAM memory cells (not shown) in a similar manner. The wordlines $WL_1, WL_2, \ldots, WL_R$ may be connected to the RRAM memory cells 102 arranged in the same row.

The RRAM memory cell 102 may be read by asserting the wordline and driving either positive and negative current or voltage on the first bitline terminal BLP. The voltage or current is compared to one or more thresholds to identify a state of the RRAM memory cell. The RRAM elements may be damaged when the read or write current or voltage is too high.

SUMMARY

A resistive random access memory system includes a plurality of bitlines, a plurality of wordlines, and an array of resistive random access memory cells. Each of the resistive random access memory cells in the array includes a transistor and a resistive random access memory element connected in a common gate configuration.

A method for operating a resistive random access memory system includes connecting a plurality of bitlines and a plurality of wordlines to an array of resistive random access memory cells. Each of the resistive random access memory cells in the array includes a transistor and a resistive random access memory element. The method includes connecting the transistor and the resistive random access memory element in a common gate configuration.

Further areas of applicability of the present disclosure will become apparent from the detailed description, the claims and the drawings. The detailed description and specific examples are intended for purposes of illustration only and are not intended to limit the scope of the disclosure.

Figure 1:
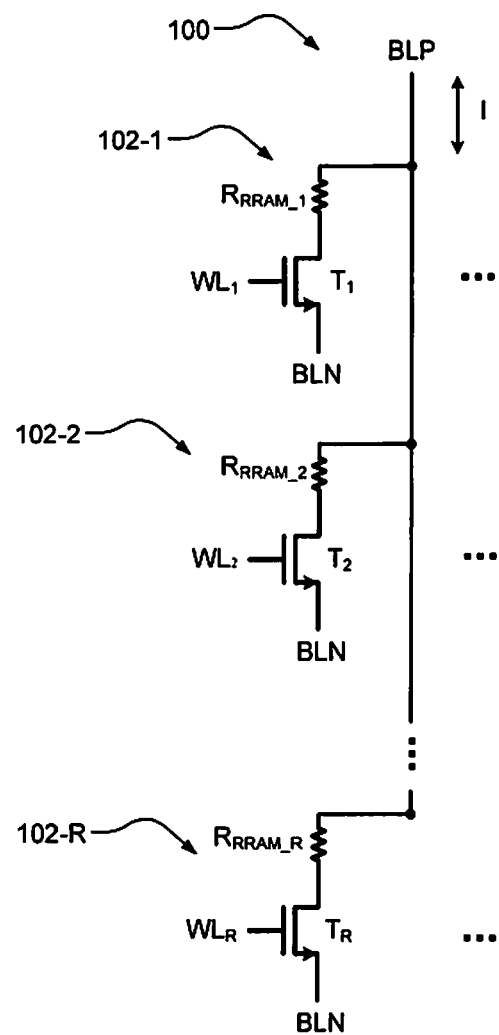
FIG. 1 is an electrical schematic of an example of a memory including a plurality of RRAM memory cells according to the prior art.

In the drawings, reference numbers may be reused to identify similar and/or identical cells.

DESCRIPTION

The systems and methods according to the present disclosure relate to a RRAM memory cell configured to improve read sensitivity and to minimize read disturbance. Once a RRAM memory cell is written, read operation can be performed in either direction of current flow. However, reading a RRAM memory cell in both directions may cause errors because a RRAM memory cell is not generally symmetric. The maximum non-disturbing voltage and current-voltage (I-V) characteristics during read may be different depending on the direction of the read current. Therefore in some examples, the systems and methods according to the present disclosure use only one of the two possible read current polarities (selected relative to the orientation of terminals of the RRAM memory cells) to improve operation.

Additionally, read operation is performed in a way that both amplifies the RRAM signal produced by the RRAM memory cell and reduces the voltage potential across the RRAM memory cell to reduce stress that can lead to read disturbance.

Figure 2:
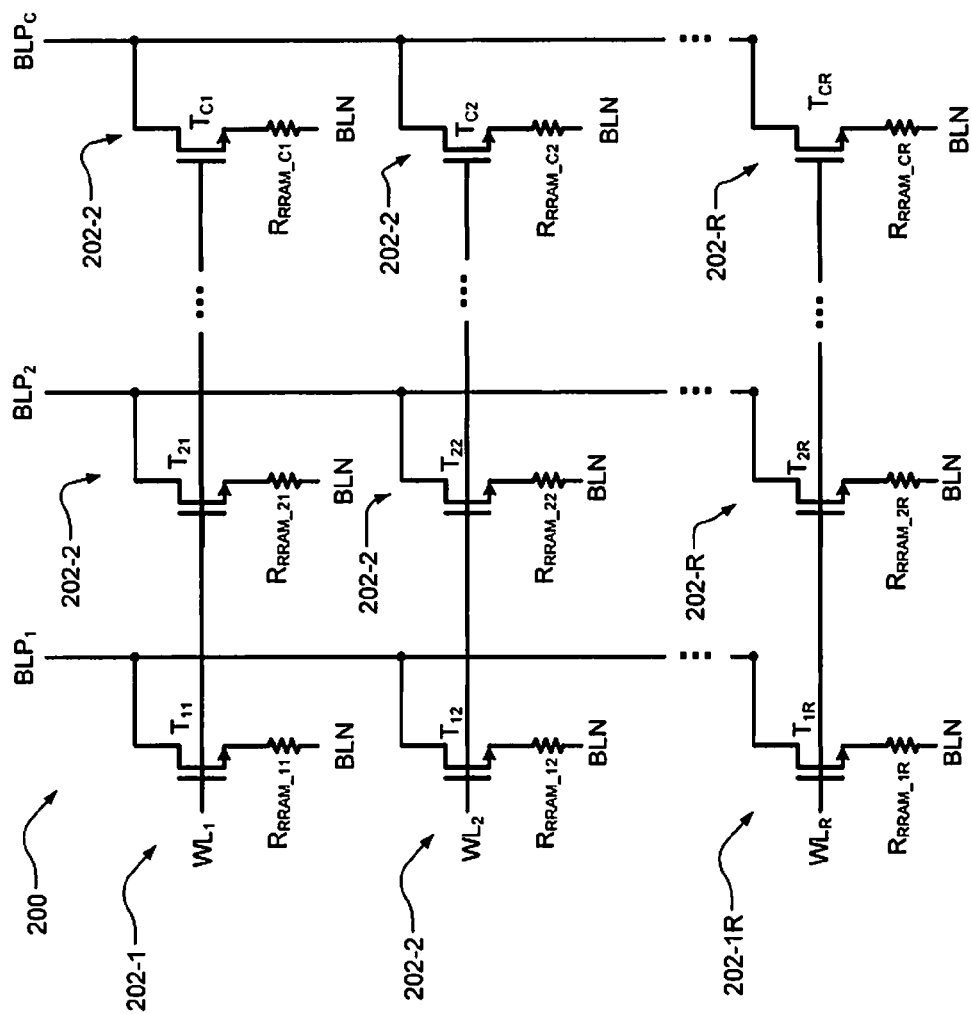
FIG. 2 is an electrical schematic of an example of a memory array including a plurality of RRAM memory cells according to one implementation of the present disclosure.

FIG. 2 shows an example of a memory array 200 including a plurality of RRAM memory cells 202-11, 202-12, ..., and 202-CR (collectively RRAM memory cells 202), where C and R are integers greater than one. The RRAM memory cells 202 in a column are connected to bitlines $BLP_1, BLP_2, \ldots,$ and $BLP_C$.

Each of the RRAM memory cells 202-11, 202-12, ..., and 202-CR includes a transistor $T_{11}, T_{12}, \ldots,$ and $T_{CR}$ and a RRAM element represented by resistors $R_{RRAM\_11}, R_{RRAM\_12}, \ldots,$ and $R_{RRAM\_CR}$, respectively. First terminals of the transistors $T_{11}, T_{12}, \ldots$ and $T_{CR}$ are connected to one polarity of a corresponding one of the bitlines $BP_1, BLP_2, \ldots,$ and $BLP_C$.

One end of the RRAM elements $R_{RRAM\_11}, R_{RRAM\_12}, \ldots,$ and $R_{RRAM\_CR}$ is connected to second terminals of the transistors $T_{11}, T_{12}, \ldots,$ and $T_{CR}$. Another end of the RRAM elements $R_{RRAM\_11}, R_{RRAM\_12}, \ldots,$ and $R_{RRAM\_CR}$ is connected to an opposite polarity of a bitline terminals BLN, which may be a negative or ground reference. Gates of the transistors $T_{11}, T_{12}, \ldots,$ and $T_{CR}$ are connected to wordlines $WL_1, WL_2, \ldots,$ and $WL_R$, respectively. As can be appreciated, while the transistors $T_1, T_2, \ldots$ and $T_R$ are shown as NMOS transistors, PMOS transistors or other types of access devices may be used.

With the NMOS implementation in FIG. 2, a positive voltage is applied a selected one of the bitline terminals BLP and a negative voltage or ground reference is applied to the bitline terminals BLN. This configuration provides a more sensitive reading of the RRAM resistance as compared to FIG. 1 due to an amplification effect.

When the RRAM elements are in a high resistive state, there may be a high current or voltage across the RRAM element during reading. To avoid disturbing the RRAM memory cell during read operation, limiting the voltage (or current) across the cell may be desirable. Voltage or current limiting circuits can be added to each RRAM memory cell, however this will increase die size and cost. The configuration in FIG. 2 provides a natural limit on voltage across the RRAM memory cell because the maximum voltage will be limited to $V_{WL} - V_T$, where $V_{WL}$ is a wordline voltage and $V_T$ is a threshold voltage of the transistor. The wordline voltage $V_{wL}$ can be limited to the amount needed to turn on the transistor. Therefore, the systems and methods according to the present disclosure limit the voltage applied to the RRAM elements without adding additional circuit components to each RRAM memory cell.

Another advantage of the configuration of FIG. 2 is that capacitance as seen on BLP node will be lower as compared to the capacitance in the configuration of FIG. 1. Lower capacitance will lead to faster/more sensitive read operation.

The RRAM memory cells in FIG. 1 have a common source configuration. The placement of RRAM element relative to the switching transistor in FIG. 2 is selected to take advantage of the amplifying effect of a common gate configuration where WL is the common gate, a resistor value of the RRAM element (at one terminal of the transistor) is the input signal to be detected, and a remaining terminal of the transistor is where the amplified output signal is measured. In other words, in this configuration, $V_{DS} > V_{GS} - V_T$ and the drain current is a square of a function of $V_{GS} - V_T$. The arrangement protects the RRAM element from read disturbance with minimum number of components per memory cell and allows faster read operation due to less parasitic capacitance seen on the measured node (the BLP terminal).

Figure 3:
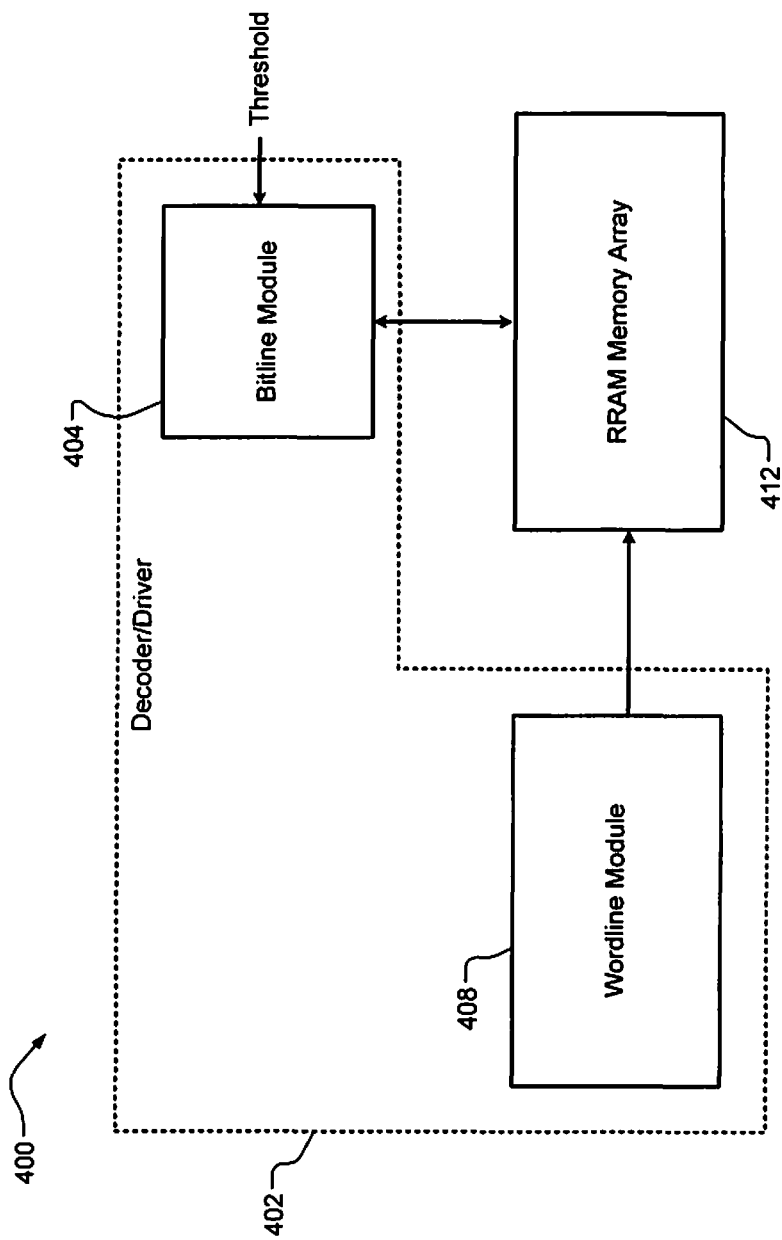
FIG. 3 is functional block diagram of a memory array according to one implementation of the present disclosure.
Figure 4:
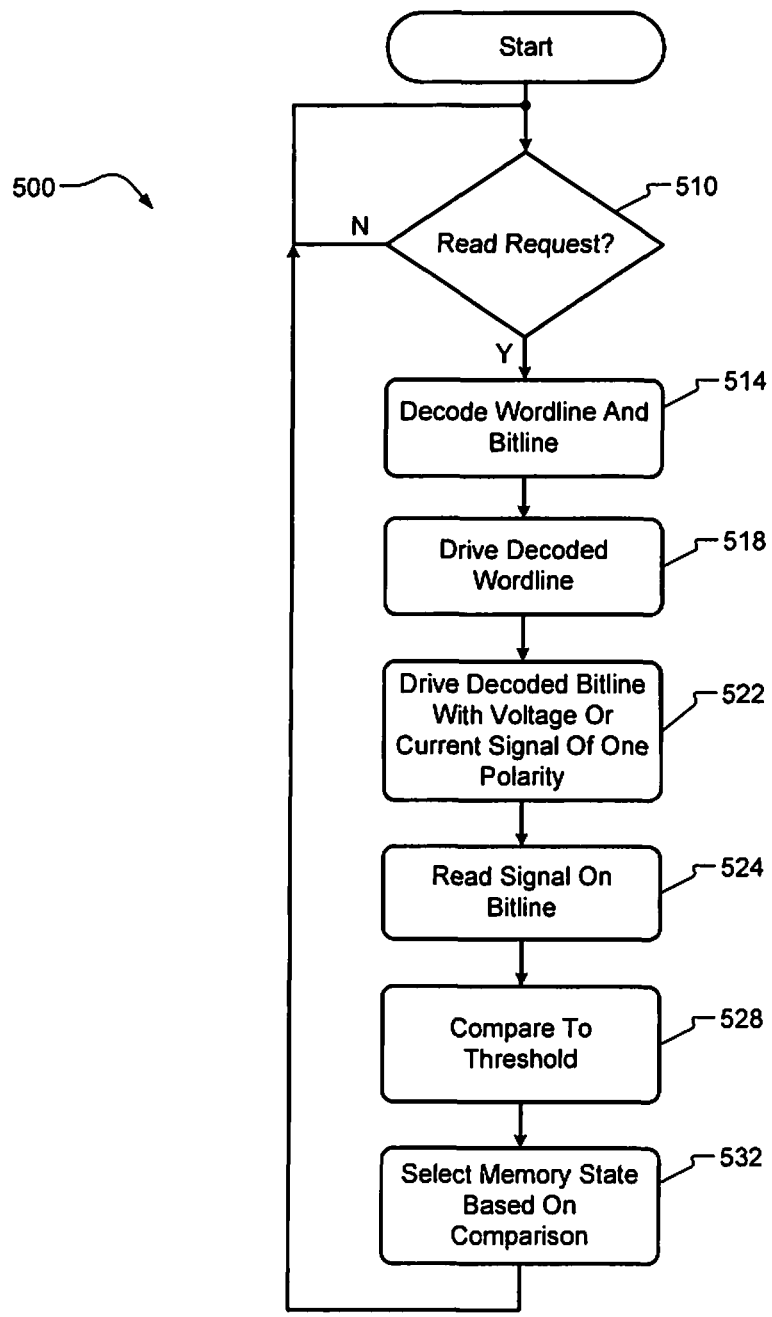
FIG. 4 is an example of a flowchart illustrating operation of the memory array according to one implementation of the present disclosure.

Referring now to FIGS. 3 and 4, operation of a memory system according to the present disclosure is shown. In FIG. 3, a memory system 400 is shown to include a decoder/driver 402 including a bitline module 404 and a wordline module 408. The memory system 400 also includes a RRAM memory array 412. The bitline module 404 decodes read and write commands and selectively drives the bitlines BLP using a predetermined current or voltage. The wordline module 408 decodes read and write commands and selectively drives the wordline terminals WL. The bitline module 404 also compares a sensed current or voltage to one or more predetermined values to determine a logical level of a particular RRAM memory cell.

In FIG. 4, a flowchart 500 illustrating operation of an example of a memory system according to the present invention is shown. At 510, control determines whether a read request occurs. If not, control returns to 510. If 510 is true, control decodes the wordlines and bitlines and drives a decoded wordline at 518. At 522, control drives the decoded bitline with a voltage or current signal of one polarity relative to the orientation of the terminals of the RRAM elements. In other words, unlike conventional memory systems that use both polarities during reading, or a single randomly selected polarity during reading, only a single polarity is used. The selected polarity may be based on the orientation of the RRAM elements and further considerations identified above.

At 524, control reads a current or voltage signal on the selected bitline. The read back current or voltage signal is compared to one or more current or voltage thresholds at 528 and a memory state is selected based on the comparison at 532.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A resistive random access memory system, comprising:
a plurality of bitlines comprising first bitlines and a second bitline;
a plurality of wordlines; and
an array of resistive random access memory cells, wherein
each of the resistive random access memory cells in the array includes a transistor and a resistive random access memory element connected in a common gate configuration,
each of the transistors includes a first terminal and a second terminal,
a drain-source voltage of each of the transistors is greater than a difference between (i) a gate-source voltage of the corresponding transistor and (ii) a threshold voltage of a gate of the corresponding transistor,
a drain current of each of the transistors is equal to a square of a function of a difference between (i) the gate-source voltage of the corresponding transistor and (ii) the threshold voltage of the gate of the corresponding transistor,
the first terminals of the transistors are output terminals of the array of resistive random access memory cells,
each of the first terminals is connected to a corresponding one of the first bitlines,
the second terminals are connected respectively to the resistive random access memory elements, and
the resistive random access memory elements are connected to the second bitline.

2. The resistive random access memory system of claim 1, wherein the transistor in each of the resistive random access memory cells includes a gate terminal connected to one of the plurality of wordlines.

3. The resistive random access memory system of claim 1, wherein each of the second terminals is connected to a respective one of the resistive random access memory elements.

4. The resistive random access memory system of claim 1, wherein:
the resistive random access memory element in each of the resistive random access memory cells includes (i) a first terminal connected to a corresponding one of the second terminals of the transistor, and (ii) a second terminal connected to the second bitline; and
the second bitline is at a reference potential.

5. The resistive random access memory system of claim 1, further comprising a bitline module configured to decode and drive the plurality of bitlines connected to the array.

6. The resistive random access memory system of claim 5, wherein the bitline module is configured to drive the plurality of bitlines during reading using a current signal or a voltage signal having only one polarity relative to an orientation of the resistive random access memory elements.

7. The resistive random access memory system of claim 1, further comprising a wordline module configured to decode and drive the plurality of wordlines connected to the array.

8. A method for a resistive random access memory system, the method comprising:
connecting a plurality of bitlines and a plurality of wordlines to an array of resistive random access memory cells, wherein each of the resistive random access memory cells in the array includes a transistor and a resistive random access memory element, wherein a drain-source voltage of each of the transistors is greater than a difference between (i) a gate-source voltage of the corresponding transistor and (ii) a threshold voltage of a gate of the corresponding transistor, and wherein a drain current of each of the transistors is equal to a square of a function of a difference between (i) the gate-source voltage of the corresponding transistor and (ii) the threshold voltage of the gate of the corresponding transistor;
connecting the transistor and the resistive random access memory element of each of the resistive random access memory cells in a common gate configuration;
receiving a read request;
subsequent to receiving the read request, decoding the plurality of wordlines and the plurality of bitlines;
during reading and subsequent to decoding the plurality of wordlines and the plurality of bitlines,
driving one of the decoded plurality of wordlines, and
driving one of the decoded plurality of bitlines with only a single polarity based on an orientation of (i) the resistive random access memory elements, or (ii) terminals of the resistive random access memory cells;
subsequent to driving (i) the one of the decoded plurality of wordlines, and (ii) the one of the decoded plurality of bitlines with only the single polarity, reading a current signal or a voltage signal on the one of the decoded plurality of bitlines;
comparing the current signal or the voltage signal to a threshold; and
selecting a memory state based on the comparing of the current signal or the voltage signal to the threshold.

9. The method of claim 8, wherein the transistor in each of the resistive random access memory cells includes a gate terminal connected to one of the plurality of wordlines.

10. The method of claim 8, further comprising connecting second terminals of the transistors in each of the resistive random access memory cells respectively to the resistive random access memory elements.

11. The method of claim 8, wherein the resistive random access memory element in each of the resistive random access memory cells includes (i) a first terminal connected to a corresponding one of the transistors, and (ii) a second terminal connected to a reference potential.

12. The method of claim 8, further comprising decoding and driving the plurality of bitlines connected to the array.

13. The method of claim 8, further comprising decoding and driving the plurality of wordlines connected to the array.

14. The resistive random access memory system of claim 1, wherein:
a polarity of the first bitlines is positive; and
a polarity of the second bitline is negative.

15. The method of claim 8, further comprising:
connecting first terminals respectively to the plurality of bitlines, wherein each of the transistors includes (i) a respective one of the first terminals, and (ii) a second terminal; and connecting the second terminals respectively to the resistive random access memory elements.

16. The method of claim 8, further comprising:

connecting first terminals respectively to first bitlines of the plurality of bitlines, wherein each of the transistors includes (i) a respective one of the first terminals, and (ii) a second terminal; and directly connecting the second terminals (i) respectively to the resistive random access memory elements, or (ii) to a second bitline of the plurality of bitlines.

17. The method of claim 8, further comprising:

connecting first terminals respectively to first bitlines of the plurality of bitlines, wherein each of the transistors includes (i) a respective one of the first terminals, and (ii) a second terminal;

directly connecting the second terminals respectively to the resistive random access memory elements; and directly connecting the resistive random access memory elements to a second bitline of the plurality of bitlines.

18. The method of claim 17, wherein:

a polarity of the first bitlines is positive; and a polarity of the second bitline is negative.

19. The method of claim 8, wherein the one of the decoded plurality of bitlines is driven based on the orientation of the resistive random access memory elements.

20. The method of claim 8, wherein the one of the decoded plurality of bitlines is driven based on the orientation of the terminals of the resistive random access memory cells.

21. The resistive random access memory system of claim 1, wherein:

the second terminals are directly connected respectively to the resistive random access memory elements; and the resistive random access memory elements are directly connected to the second bitline.

\* \* \* \* \*